(12) United States Patent
Fumitake

(10) Patent No.: US 8,877,575 B2
(45) Date of Patent: Nov. 4, 2014

(54) COMPLEMENTARY JUNCTION FIELD EFFECT TRANSISTOR DEVICE AND ITS GATE-LAST FABRICATION METHOD

(71) Applicant: Semiconductor Manufacturing International Corporation (Shanghai), Shanghai (CN)

(72) Inventor: Mieno Fumitake, Shanghai (CN)

(73) Assignees: Semiconductor Manufacturing International (Beijing) Corporation (CN); Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 13/626,634

(22) Filed: Sep. 25, 2012

(65) Prior Publication Data
US 2013/0168741 A1 Jul. 4, 2013

(30) Foreign Application Priority Data
Dec. 31, 2011 (CN) .......................... 2011 1 0459296

(51) Int. Cl.
*H01L 21/337* (2006.01)

(52) U.S. Cl.
USPC ................... 438/186; 257/256; 257/E21.445; 257/E29.31; 257/E21.394

(58) Field of Classification Search
USPC ............. 438/186; 257/256, E21.445, E29.31, 257/E21.394
See application file for complete search history.

(56) References Cited

U.S. PATENT DOCUMENTS

2002/0037619 A1* 3/2002 Sugihara et al. .............. 438/289
2010/0062577 A1* 3/2010 Liao et al. ..................... 438/301

* cited by examiner

*Primary Examiner* — Timor Karimy
(74) *Attorney, Agent, or Firm* — Innovation Counsel LLP

(57) ABSTRACT

The disclosure relates to a complementary junction field effect transistor (c-JFET) and its gate-last fabrication method. The method of fabricating a semiconductor device includes: forming a dummy gate on a first conductivity type wafer, forming sidewall spacers on opposite sides of the dummy gate, forming a source and a drain regions on the opposite sides of the dummy gate, removing the dummy gate, forming a first semiconductor region of a second conductivity type in an opening exposed through the removing the dummy gate, and forming a gate electrode in the opening.

30 Claims, 8 Drawing Sheets

COMPLEMENTARY JUNCTION FIELD EFFECT TRANSISTOR DEVICE AND ITS GATE-LAST FABRICATION METHOD

CROSS-REFERENCE TO RELATED APPLICATIONS

This application claims priority to Chinese Patent Application No. 201110459296.X, filed on Dec. 31, 2011 and entitled "A COMPLEMENTARY JUNCTION FIELD EFFECT TRANSISTOR DEVICE AND ITS GATE-LAST FABRICATION METHOD", which is incorporated herein by reference in its entirety.

BACKGROUND OF THE DISCLOSURE

1. Field of the Disclosure

Embodiments of the present invention relate to a complementary junction field effect transistor (c-JFET) and its metal gate-last fabrication method of a c-JFET device.

2. Description of the Related Art

Currently, with the continuous shrink of the size of transistors, the High-k insulating layer plus metal gate (HKMG) technique has been almost an indispensable selection for fabricating small size transistors. With regard to the processes of fabricating transistors with HKMG structures, two fabrication processes are available, that is, a gate-first process and a gate-last process. It is generally considered that the difficulty of forming HKMG structures through the gate-first process may arise in the control of the threshold voltage of PMOS transistors. In order to lower the threshold voltage of PMOS transistors, the structures and designs of the semiconductor device should be greatly modified in the gate-first process, which may disadvantageously increase process complexity and fabrication costs. Thus, the inventor of this invention deems that the gate-last process is more preferable for PMOS transistors.

Presently, complementary junction field effect transistors (c-JFET) have been widely used in many applications. However, all fabrication methods of c-JFET are gate-first methods. There isn't any gate-last fabrication method for c-JFET introduced and applied in the prior art, and no such a fabrication process is introduced in related literatures as well. The inventor has found that fabricating c-JFET through metal gate last fabrication methods can produce highly favourable effects.

SUMMARY

According to one exemplary embodiment of the present invention, there is provided a method of fabricating a semiconductor device comprising: forming a dummy gate on a first conductivity type wafer, forming sidewall spacers on opposite sides of the dummy gate, forming a source and a drain regions on the opposite sides of the dummy gate, removing the dummy gate; forming a first semiconductor region of a second conductivity type in an opening exposed through the removing the dummy gate, and forming a gate electrode in the opening.

The method further comprises forming a well of a second conductivity type below the wafer surface through the opening exposed through the removing the dummy gate.

The method further comprises forming an insulating layer below the dummy gate, and the insulating layer located below the dummy gate is removed at the same time of the removing the dummy gate.

The method further comprises annealing the wafer after forming the well, the annealing is long pulse rapid annealing, and the annealing is performed at a temperature of about 800° C.~about 1200° C. for a period of time of about 2 ms~about 8 ms.

The method further comprises forming an insulating layer below the dummy gate, and an annealing is performed with the insulating layer on the wafer.

The annealing is performed at a temperature of about 700° C.~about 850° C. for about 0.5 min~about 2 min.

The well is formed below the wafer surface at a distance of about 50 nm~about 100 nm.

The forming a well is performed through ion implanting the second conductivity type through the opening so as to form the well of the second conduction type in the wafer.

The well of the second conductivity type is formed through implanting As ions.

The ion implanting the second conductivity type is performed at about 30 keV~about 50 keV, and at about $0.5E16$ $cm^{-2}$~about $6.0E16$ $cm^{-2}$.

The first conductivity type is P type.

The second conductivity type is N type.

The method further comprises forming openings in the source and the drain regions after forming the source and the drain regions, epitaxial growing a semiconductor material different from the wafer material in the openings of the source and the drain regions so as to form second semiconductor regions, forming an insulating layer on the source and the drain regions to cover the second semiconductor regions, and forming openings in the insulating layer to expose the second semiconductor regions.

The second semiconductor regions are SiGe.

The insulating layer is different from the sidewall spacers.

The forming a gate electrode comprises depositing a metal after forming the first semiconductor region of the second conductivity type in the opening formed through the removing the dummy gate, so that the metal contacts the second semiconductor regions are formed in the openings of the insulating layer, and the metal gate is formed in the opening formed through removing the dummy gate.

The first semiconductor region of the second conduction type is formed through selective epitaxial growth of a layer having phosphorous.

The forming a gate in the opening further comprises forming a first semiconductor region of a second conduction type in the opening through selective epitaxial growth; and depositing a metal on the first semiconductor region to form a metal gate.

The thickness of the first semiconductor region is about 20 nm~about 50 nm.

According to one embodiment of the present invention, there is provided a c-JFET semiconductor device comprising: a substrate of a first conductivity type, a gate electrode formed on the substrate, a semiconductor region of a second conduction type located between the gate electrode and the substrate, source and drain regions formed on the opposite sides of the gate electrode, and a well of a second conduction type formed below the semiconductor surface and between source and drain regions.

The c-JFET semiconductor device further comprises sidewall spacers formed on the opposite sides of the gate electrode, an insulating layer formed on the opposite sides of the sidewall spacers, second semiconductor regions formed in the source and the drain regions and raised above the substrate surface, and metal contacts formed in the insulating layer and connected to the second semiconductor regions.

BRIEF DESCRIPTION OF THE DRAWINGS

Referring to the accompanying drawings, some preferable embodiments of this invention will be described. In those drawings, the same reference labels are used to refer to the same structural elements.

DESCRIPTION OF THE EMBODIMENTS

Referring to the accompanying drawings, some exemplary embodiments of this invention will be described. In those drawings, the same reference labels are used to refer to the same structural elements.

Exemplary Embodiment 1

Figure 1:
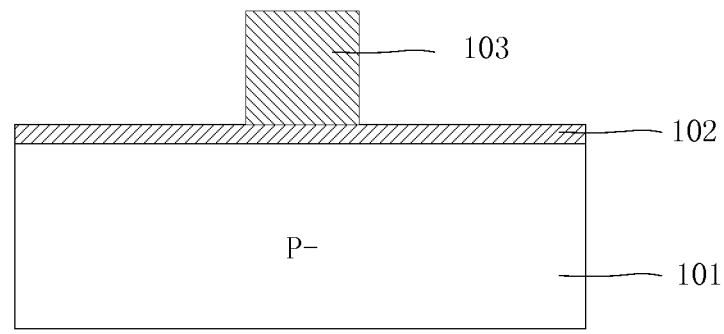
FIGS. 1-6 show a gate-last fabrication method of a c-JFET according to a first exemplary embodiment of this disclosure.

As shown in FIG. 1, the fabrication method starts from providing a wafer 101, for example, a P-type wafer. A gate insulating layer 102 is formed on the wafer 101. As shown in the figure, a patterned dummy gate 103 is formed on the gate insulating layer 102. In one embodiment, the patterned dummy gate 103 as shown in FIG. 1 can be formed through depositing a suitable material, such as polycrystalline silicon, on the gate insulating layer 102, followed by patterning.

Figure 2:
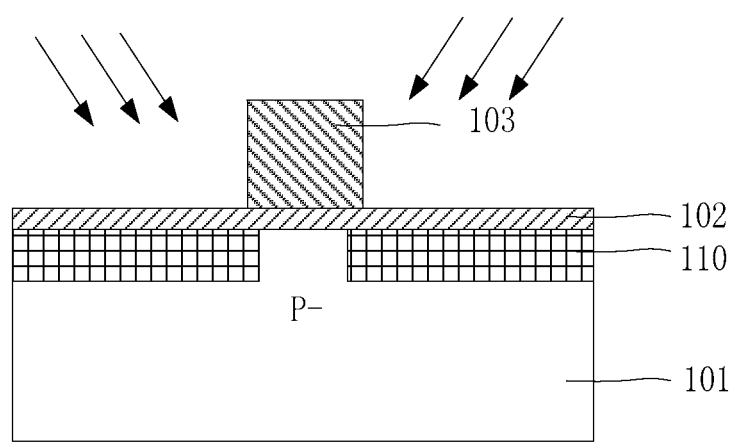
Figure 3:
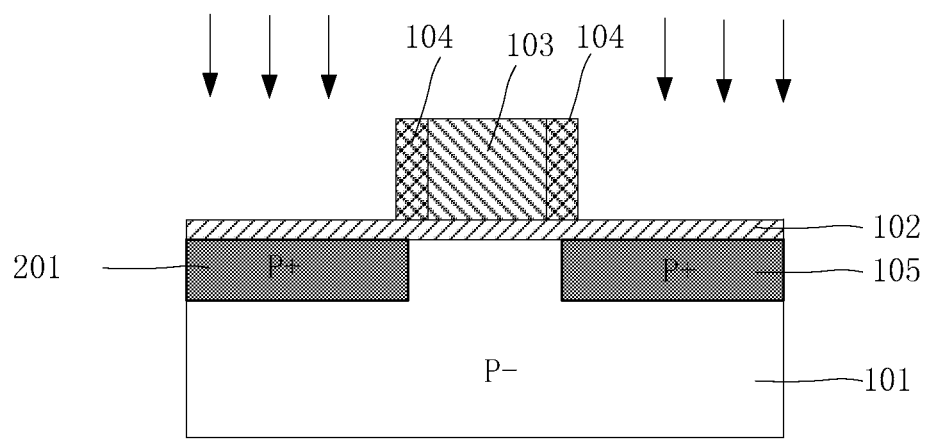

Shallow doping is carried out to form lightly doped drain (LDD) regions on the opposite sides of the dummy gate 103, as shown in FIG. 2. Sidewall spacers 104 are formed on the opposite sides of the dummy gate 103, as shown in FIG. 3. In one embodiment, the sidewall spacers 104 can be formed by depositing insulating material, such as $SiO_2$, on the gate insulating layer 102 and etching the insulating material without a mask to leave portions of sidewall spacers 104 on the opposite sides of the dummy gate 103. Certainly, those skilled in the art can form the sidewall spacers 104 by other suitable materials. Source/drain regions 105 (for example, heavily doped source/drain regions) are formed on the opposite sides of the sidewall spacers 104. For example, the source/drain regions 105 can be formed on the opposite sides of the sidewall spacers 104 through heavily doping the substrate 101. In one embodiment, the conditions of the heavily doping are: doping B ions at a concentration of $1E20 \sim 1E21$ atom/$cm^{-3}$. Those skilled in the art can select other doping concentrations and other kinds of ions as needed. According to one embodiment of the disclosure, the source/drain regions 105 have a P+ type conductivity, as shown in the figures.

Figure 4:
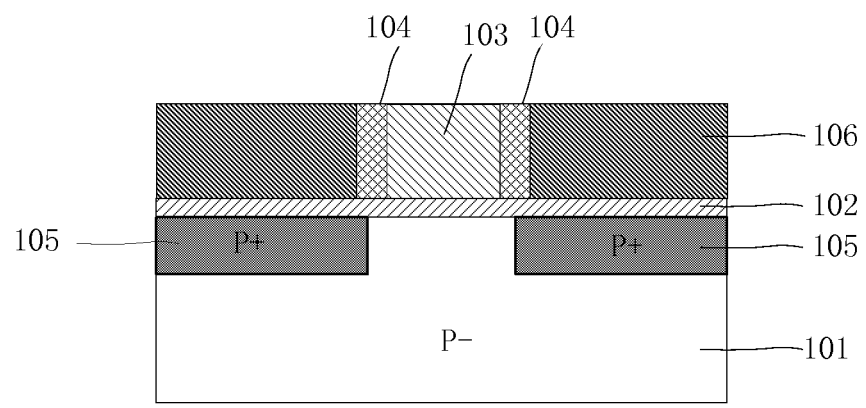

In FIG. 4, after forming the source/drain regions 105, an insulating layer 106 is deposited to cover the gate insulating layer 102 exposed on the opposite sides of the dummy gate 103, followed by planarization to expose the dummy gate 103 and sidewall spacers 104. In one embodiment, the planarization can be performed through chemical mechanical polishing (CMP) process. Here, those skilled in the art can select the suitable materials of the insulating layer 106 as needed. In one embodiment, the material of the insulating layer 106 can be the same as that of the sidewall spacers 104. In another embodiment, a different material can be adopted, such as, SiN.

Figure 5:
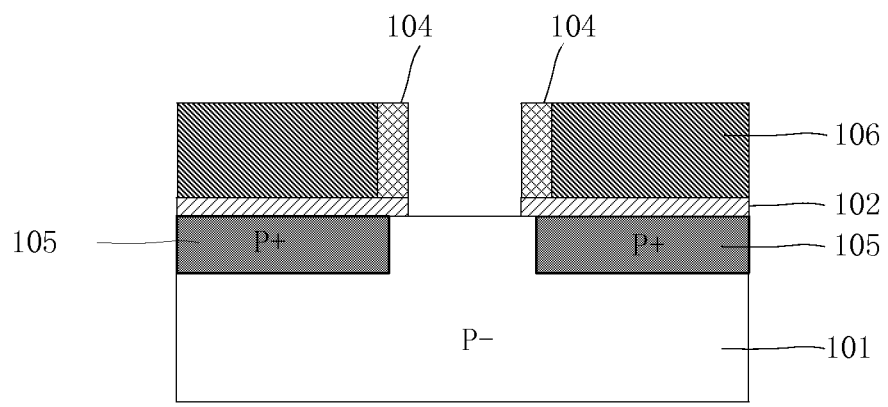
Figure 6:
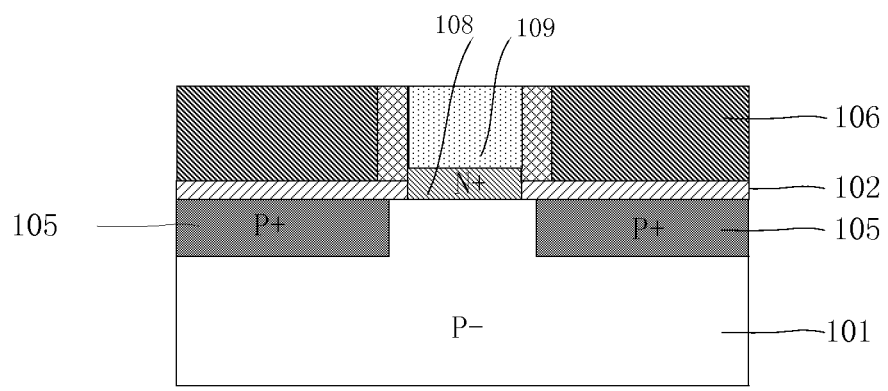

The dummy gate 103 is removed to expose an opening as shown in FIG. 5. In one embodiment, the dummy gate 103 can be removed through selective etching. In another embodiment, the dummy gate 103 can be removed through photolithography with a mask. As shown in FIG. 6, a first semiconductor region 108 of N type is selectively grown in the opening exposed by removing the dummy gate 103. In one embodiment, the first semiconductor region 108 can be formed through selective epitaxial growth of N-type semiconductor layer having N-type ions (phosphorus) in the opening. In one embodiment, the first semiconductor region 108 can be about 20 nm~about 50 nm thick.

As shown in FIG. 6, a metal is deposited on the first semiconductor region 108 to form a metal gate 109. In one embodiment, the metal gate 109 may be Ti/TiN/W or Ta/TaN/Cu or Ti/TiN/Al.

Thus, the c-JFET device according to the first embodiment of the disclosure is completed. It can be seen that c-JFET device according to the first embodiment of the disclosure is fabricated through a gate-last process, that is, a dummy gate 103 is used in the device at first, which, as part of the device, participates the formation of other parts of the device, and is removed at substantially the last stage of the process for the formation of the metal gate 109.

Exemplary Embodiment 2

Figure 7:
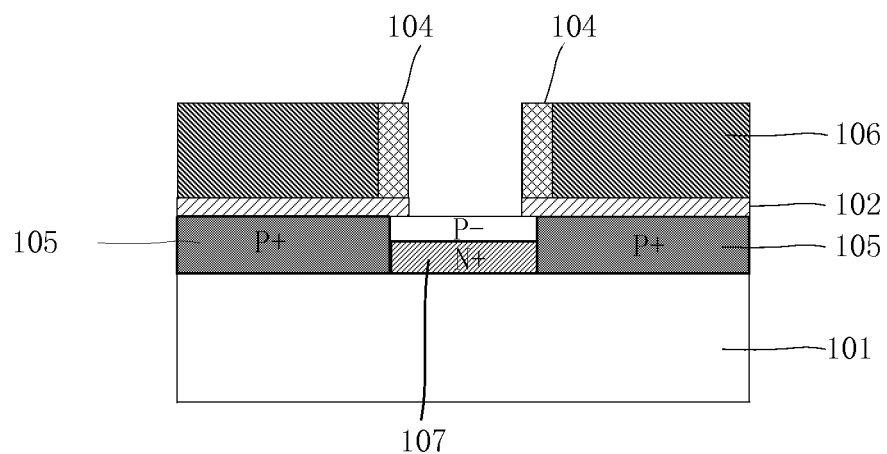
FIGS. 7-9 show a gate-last fabrication method of a c-JFET according to a second exemplary embodiment of this disclosure.

After removing the dummy gate 103 as shown in FIG. 5, N-type well 107 is formed in the wafer 101 through the opening formed by removing the dummy gate 103, as shown in FIG. 7. The well 107 is formed through ion implantation of As ions. The conditions of the ion implantation are: 30~50 keV, with ion concentration at $0.5 E16$ $cm^{-2} \sim 6.0E16$ $cm^{-2}$. Certainly, those skilled in the art can choose different ion implantation conditions as needed. Then thermal annealing is carried out. The annealing method may be long pulse rapid annealing, under the annealing conditions of annealing at the temperature of $800°$ C.~$1200°$ C. for a period of time of about 2 ms~about 8 ms. Oxidation is carried out after the annealing.

As shown in the figure, the distance from the well 107 to the surface of the wafer 101 can be controlled by the ion implantation conditions. In one embodiment of the disclosure, the distance of the well 107 from the surface of the wafer 101 may be about 50 nm~about 100 nm.

Figure 8:
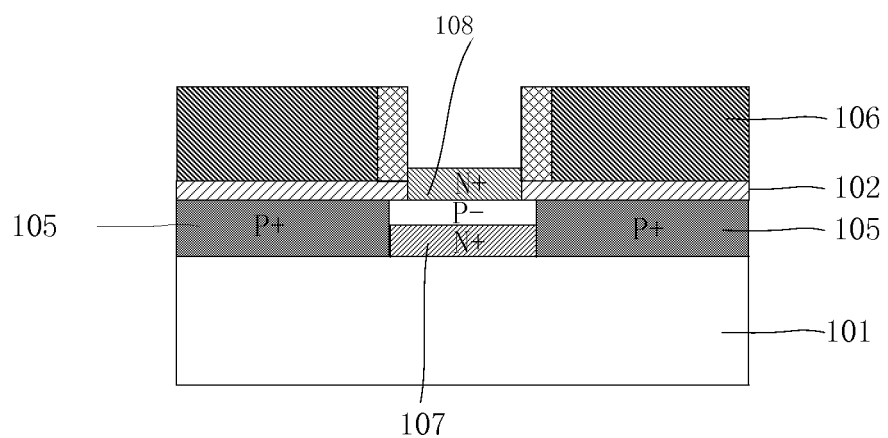

Next, as shown in FIG. 8, a first semiconductor region 108 of the N-type is selectively grown from the opening exposed by removing the dummy gate 103. In one embodiment, N-type semiconductor layer having N-type ions are grown by selective epitaxial growth from the opening to form the first semiconductor region 108. In one embodiment, the first semiconductor region 108 can be about 20 nm~about 50 nm thick.

Figure 9:
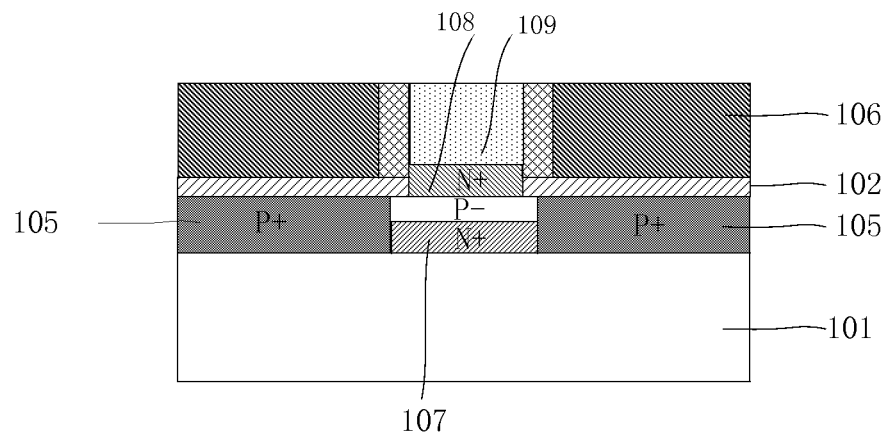

As shown in FIG. 9, a metal can be deposited on the first semiconductor region 108 to form a metal gate 109. In one embodiment, the metal gate 109 can be formed with the same metal as that of embodiment 1.

Thus, the c-JFET device according to the second embodiment of the disclosure is completed. The second embodiment according to the disclosure can be regarded as additionally forming a well 107 on the basis of the c-JFET of the first embodiment of the disclosure. A reverse bias can be applied to the well 107 to control the threshold voltage of the c-JFET during operation of the c-JFET.

Exemplary Embodiment 3

Figure 10:
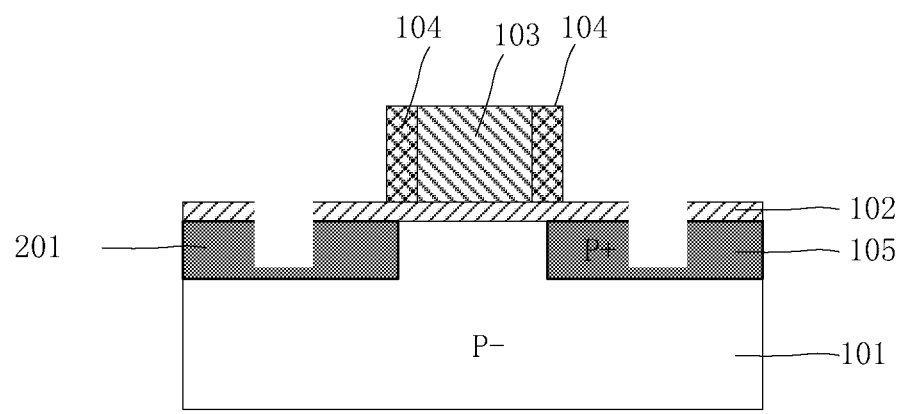
FIGS. 10-15 show a gate-last fabrication method of a c-JFET according to a third exemplary embodiment of this disclosure.
Figure 11:
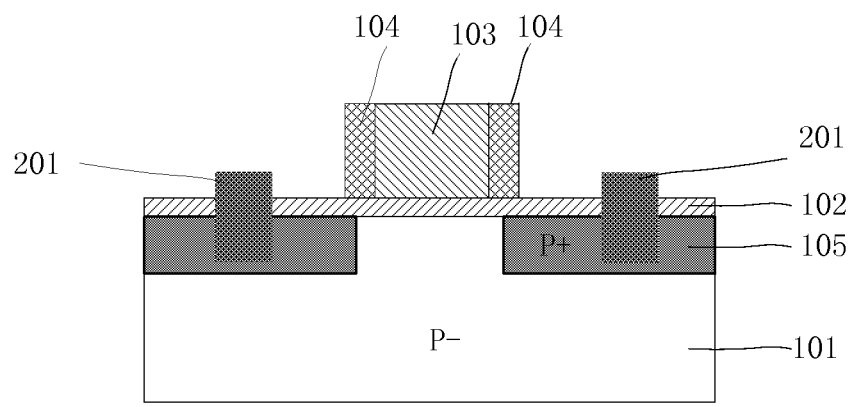

After forming the source and the drain regions 105 as shown in FIG. 3, openings are formed in the source and the drain regions 105, as shown in FIG. 10, respectively. Then, as shown in FIG. 11, second semiconductor regions 201 are formed through selective epitaxial growth of a semiconductor material different from the wafer 101 in the openings. In one embodiment, SiGe can be formed through selective epitaxial growth to form the second semiconductor regions 201.

Figure 12:
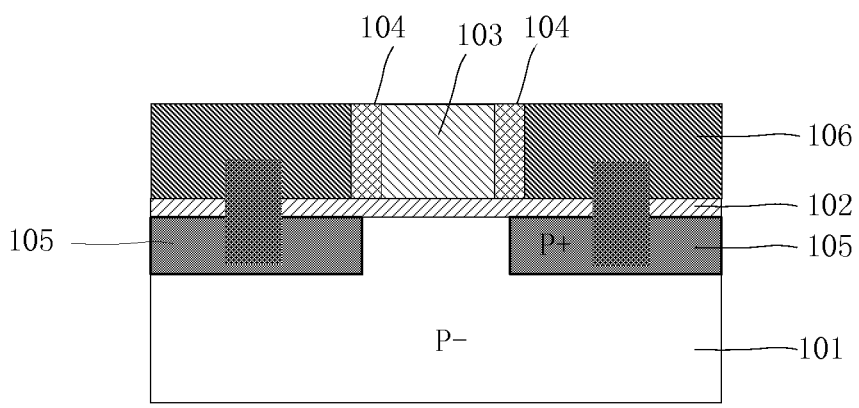

Then as shown in FIG. 12, an insulating layer 106 is deposited to cover the exposed gate insulating layer 102 and the second semiconductor regions 201, followed by planarization to expose the dummy gate 103 and the sidewall spacers 104. In one embodiment, the planarization can be performed through chemical mechanical polishing (CMP). Those skilled in the art can select the material of the insulating layer 106 as appropriate. In one embodiment, the material of the insulating layer 106 can be as same as that of the sidewall spacers 104. In another embodiment, a different material can be employed, such as, SiN.

Figure 13:
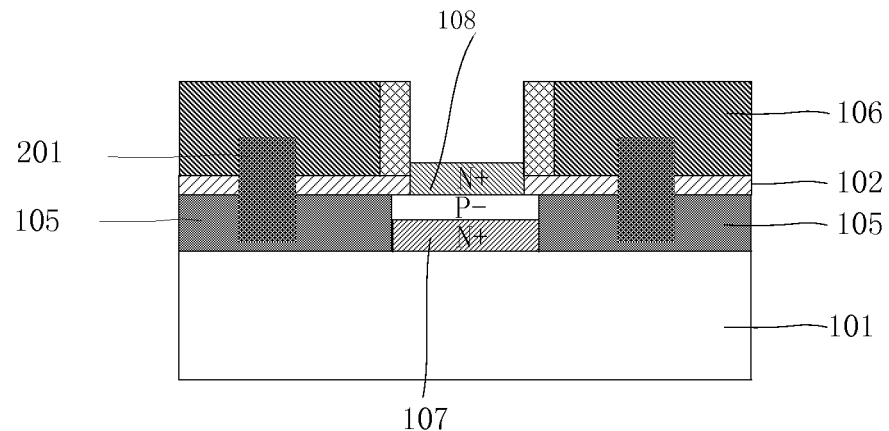

As shown in FIG. 13, the dummy gate 103 is removed. Ions are implanted to form the well 107 through the opening formed through removing the dummy gate 103. The conditions of the ion implantation can be the same as that of the embodiment 2. Then, a first semiconductor region 108 is formed through selective epitaxial growth of a semiconductor material different from the wafer 101 in the opening. In one embodiment, the first semiconductor region 108 can be formed through selective epitaxial growth of N-type semiconductor having N-type (phosphorus) ions in the first semiconductor region. In one embodiment, the thickness of the first semiconductor region 108 can be the same as that of the second embodiment.

Figure 14:
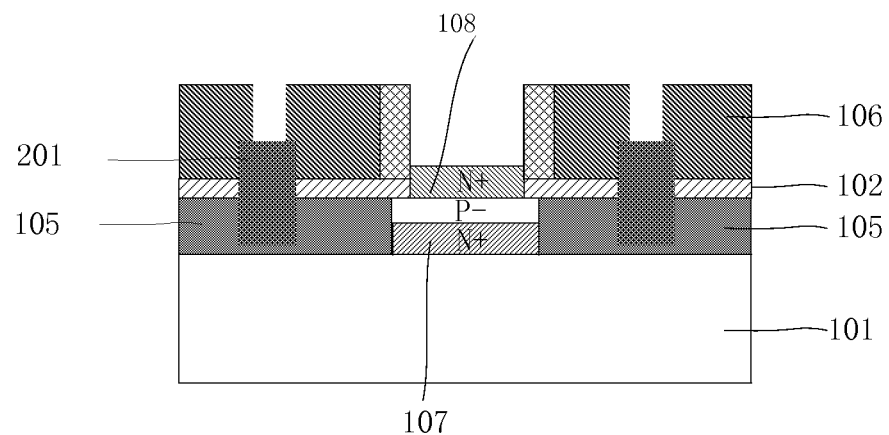
Figure 15:
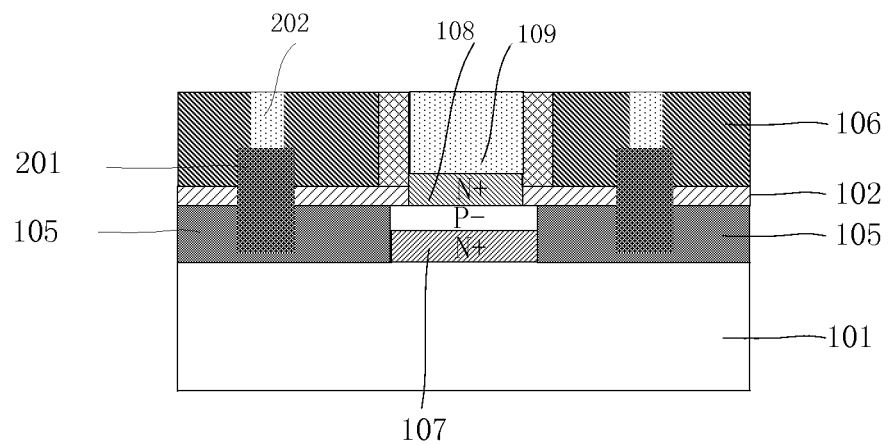

As shown in FIG. 14, openings are formed in the insulating layer 106 through photolithography technology using a mask so as to expose second semiconductor regions 201 on the opposite sides of the source/drain regions 105.

A metal is deposited to form metal contacts 202 on the second semiconductor regions 201, and a metal gate 109 in the opening on the first semiconductor region 108.

Thus, the c-JFET device according to the third embodiment of the disclosure is completed. The third exemplary embodiment according to the disclosure can be regarded as additionally forming the second semiconductor regions 201 and metal contacts 202 on the basis of the c-JFET of the second embodiment of the disclosure. By forming the metal contacts 202, contact resistance can be reduced in the semiconductor device and performance of the semiconductor device can be improved accordingly.

Exemplary Example 4

In the exemplary embodiment 3 according to the disclosure, a well 107 is additionally formed in the wafer 101. However, in the exemplary embodiment 4 according to the disclosure, instead of forming the well 107, it is possible to directly form a first semiconductor region 108 in the opening, followed by the same steps as that of the third exemplary embodiment. In other words, the well 107 is not formed in the fourth exemplary embodiment according to the disclosure. For the detailed steps, refer to the steps of the first exemplary embodiment shown in FIGS. 5-6. Alternatively, it can be understood that metal contacts 202 located in the source/drain regions 105 can be added on the base of the first exemplary embodiment.

Other Exemplary Embodiments

In the above exemplary embodiments, when the dummy gate 103 is removed, a portion of the gate insulating layer 102 below the dummy gate 103 is removed at the same time. However, according to one implementation of the disclosure, it is also possible not to remove the gate insulating layer 102. In this case, the conditions of ion implantation and the annealing can be varied appropriately. It can be understood that the annealing is performed with a cap layer (the gate insulating layer 102). In one embodiment, the annealing are carrying out by rapid thermal annealing at a temperature of 700° C.~850° C. for 0.5 min ~2 min. Oxidation may be carried out after the annealing.

It can be understood that the implementation of retaining the gate insulating layer 102 and the corresponding annealing conditions can be applied to any exemplary embodiment described above.

Although several exemplary embodiments of the present invention have been described for a specific conduction type (such as P-type) with reference to the drawings, a reverse conduction type (such as N-type) can be employed in some situations, which are also be treated as falling in the protection scope of the disclosure. In this specification, the terms "substantially" or "about" are used to mean that values or positions described by such terms are expected to be very approximate to the specified values or positions. However, as well known in the art, absolute conformity with specified values or positions is always prevented by tiny deviations. As well known in the art, a deviation up to about ten percent (10%) (up to twenty percent (20%) for semiconductor doping concentration) can be considered as a reasonable deviation from an ideal target value.

The above exemplary embodiments are merely examples for the convenience of illustration. The scope claimed by the disclosure should be in accordance with the scope of this patent application, and is no way limited to the above exemplary embodiments.

What is claimed is:

1. A method of fabricating a semiconductor device comprising:
    forming a dummy gate on a surface of a first conductivity type wafer;
    forming sidewall spacers on opposite sides of the dummy gate;
    forming a first conductivity type source and a drain regions on the opposite sides of the dummy gate, wherein the first conductivity type source and drain regions directly contact the first conductivity type wafer;
    removing the dummy gate;
    forming a first semiconductor region of a second conductivity type in an opening exposed through the removing the dummy gate, a substantial portion of the first semiconductor region being higher than the surface of the first conductivity type wafer; and
    forming a gate electrode in the opening.

2. The method according to claim 1, further comprising: forming a well of a second conductivity type below the wafer surface through the opening exposed through the removing the dummy gate.

3. The method according to claim 2, further comprising: forming an insulating layer below the dummy gate, and wherein the insulating layer located below the dummy gate is removed at the same time of the removing the dummy gate.

4. The method according to claim 3, further comprising: annealing the wafer after forming the well, and wherein the annealing is long pulse rapid annealing and the annealing is performed at a temperature of about 800° C.~about 1200° C. for a period of time of about 2 ms~about 8 ms.

5. The method according to claim 2, further comprising: forming an insulating layer below the dummy gate, and wherein an annealing is performed with the insulating layer on the wafer.

6. The method according to claim 5, wherein the annealing is performed at a temperature of about 700° C.~about 850° C. for about 0.5 min~about 2 min.

7. The method according to claim 2, wherein the well is formed below the wafer surface at a distance of about 50 nm~about 100 nm.

8. The method according to claim 2, wherein the forming a well is performed through ion implanting the second conductivity type through the opening so as to form the well of the second conduction type in the wafer.

9. The method according to claim 8, wherein the well of the second conductivity type is formed through implanting As ions.

10. The method according to claim 9, wherein the ion implanting the second conductivity type is performed at about 30 keV~about 50 keV, and at about 0.5E16 $cm^{-2}$~about 6.0E16 $cm^{-2}$.

11. The method according to claim 1, wherein the first conductivity type is P type.

12. The method according to claim 1, wherein the second conductivity type is N type.

13. The method according to claim 1, further comprising:
    forming openings in the source and the drain regions after forming the source and the drain regions;
    epitaxial growing a semiconductor material different from the wafer material in the openings of the source and the drain regions so as to form second semiconductor regions;
    forming an insulating layer on the source and the drain regions to cover the second semiconductor regions; and
    forming openings in the insulating layer to expose the second semiconductor regions.

14. The method according to claim 13, further comprising: forming a well of a second conductivity type below the wafer surface through the opening exposed through the removing the dummy gate.

15. The method according to claim 14, further comprising: forming an insulating layer below the dummy gate, and wherein the insulating layer located below the dummy gate is removed at the same time of the removing the dummy gate.

16. The method according to claim 15, further comprising: annealing the wafer after forming the well, and wherein the annealing is long pulse rapid annealing and the annealing is performed at a temperature of about 800° C.~about 1200° C. for a period of time of about 2 ms~about 8 ms.

17. The method according to claim 14, further comprising: forming an insulating layer below the dummy gate, and wherein an annealing is performed with the insulating layer on the wafer.

18. The method according to claim 17, wherein the annealing is performed at a temperature of about 700° C.~about 850° C. for about 0.5 min~about 2 min.

19. The method according to claim 14, wherein the well is formed below the wafer surface at a distance of about 50 nm~about 100 nm.

20. The method according to claim 14, wherein the forming a well is performed through ion implanting the second conductivity type through the opening so as to form the well of the second conduction type in the wafer.

21. The method according to claim 20, wherein the well of the second conductivity type is formed through implanting As ions.

22. The method according to claim 21, wherein the ion implanting the second conductivity type is performed at about 30 keV~about 50 keV, and at about 0.5E16 $cm^{-2}$~about 6.0E16 $cm^{-2}$.

23. The method according to claim 13, wherein the second semiconductor regions are SiGe.

24. The method according to claim 13, wherein the insulating layer is different from the sidewall spacers.

25. The method according to claim 24, wherein the forming a gate electrode comprises depositing a metal after forming the first semiconductor region of the second conductivity type in the opening formed through the removing the dummy gate, so that the metal contacts the second semiconductor regions are formed in the openings of the insulating layer, and the metal gate is formed in the opening formed through removing the dummy gate.

26. The method according to claim 13, wherein the first conductivity type is P type.

27. The method according to claim 13, wherein the second conductivity type is N type.

28. The method according to claim 13, wherein the first semiconductor region of the second conduction type is formed through selective epitaxial growth of a layer having phosphorous.

29. The method according to claim 1, wherein the forming a gate in the opening further comprising:
    forming a first semiconductor region of a second conduction type in the opening through selective epitaxial growth; and
    depositing a metal on the first semiconductor region to form a metal gate.

30. The method according to claim 29, wherein the thickness of the first semiconductor region is about 20 nm~about 50 nm.

* * * * *